(12) United States Patent
Chiu et al.

(10) Patent No.: US 11,211,389 B2
(45) Date of Patent: Dec. 28, 2021

(54) MEMORY DEVICE

(71) Applicant: Semiconductor Manufacturing International (Shanghai) Corporation, Shanghai (CN)

(72) Inventors: Sheng Fen Chiu, Shanghai (CN); Fansheng Kung, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 16/402,557

(22) Filed: May 3, 2019

(65) Prior Publication Data

US 2019/0259770 A1    Aug. 22, 2019

Related U.S. Application Data

(62) Division of application No. 14/509,334, filed on Oct. 8, 2014, now Pat. No. 10,325,916.

(30) Foreign Application Priority Data

Dec. 30, 2013   (CN) .......................... 201310745701.3

(51) Int. Cl.
*H01L 27/11521*     (2017.01)
*H01L 21/28*        (2006.01)
(Continued)

(52) U.S. Cl.
CPC .. *H01L 27/11521* (2013.01); *H01L 21/28247* (2013.01); *H01L 21/76897* (2013.01); *H01L 29/40114* (2019.08); *H01L 29/6656* (2013.01); *H01L 29/66825* (2013.01); *H01L 29/7881* (2013.01); *H01L 21/26513* (2013.01); *H01L 21/32134* (2013.01); *H01L 21/32137* (2013.01); *H01L 29/4916* (2013.01)

(58) Field of Classification Search
CPC ........... H01L 27/1157; H01L 27/11573; H01L 27/11524; H01L 21/0217; H01L 27/10805; H01L 27/11529
See application file for complete search history.

(56) References Cited

U.S. PATENT DOCUMENTS 5,589,413 A    12/1996  Sung et al.
5,731,242 A     3/1998  Parat et al.
(Continued)

*Primary Examiner* — Nelson Garces
*Assistant Examiner* — Quinton A Brasfield
(74) *Attorney, Agent, or Firm* — Anova Law Group, PLLC

(57) ABSTRACT

Memory devices are provided. A memory device includes one or more adjacent memory cells on a substrate. A memory cell includes first dielectric layer on the substrate, floating gate, second dielectric layer, control gate layer, and first mask layer. The control gate layer has a first portion and a second portion thereon. A silicide layer is in the control gate layer and covers at least a sidewall of the second portion of the control gate layer. In a direction parallel to a surface of the substrate, the silicide layer has a size smaller than the first portion of the control gate layer or a size of the floating gate layer. A fourth dielectric layer is on the substrate and on the memory cell. The fourth dielectric layer contains an opening exposing a portion of the substrate between adjacent memory cells. A conductive structure is in the opening.

9 Claims, 6 Drawing Sheets

(51) Int. Cl.
*H01L 29/66* (2006.01)
*H01L 29/788* (2006.01)
*H01L 21/768* (2006.01)
H01L 21/3213 (2006.01)
H01L 29/49 (2006.01)
H01L 21/265 (2006.01)

(56) References Cited

U.S. PATENT DOCUMENTS

| | | | |
|---|---|---|---|
| 6,228,712 B1* | 5/2001 | Kawai | H01L 27/115 |
| | | | 438/257 |
| 6,482,699 B1* | 11/2002 | Hu | H01L 21/76895 |
| | | | 257/E21.507 |
| 6,908,806 B2* | 6/2005 | Yang | H01L 21/28061 |
| | | | 257/E21.2 |
| 2005/0145925 A1* | 7/2005 | Ozawa | H01L 29/66825 |
| | | | 257/315 |
| 2005/0255658 A1* | 11/2005 | Wang | H01L 27/115 |
| | | | 438/290 |
| 2007/0252191 A1* | 11/2007 | Kim | H01L 27/115 |
| | | | 257/315 |
| 2008/0083947 A1 | 4/2008 | Sakuma | |
| 2009/0242960 A1 | 10/2009 | Sakuma | |
| 2011/0220982 A1* | 9/2011 | Yaegashi | H01L 27/115 |
| | | | 257/316 |
| 2012/0146125 A1* | 6/2012 | Kim | H01L 27/11524 |
| | | | 257/321 |

* cited by examiner

MEMORY DEVICE

CROSS-REFERENCES TO RELATED APPLICATIONS

This application is a divisional of U.S. patent application Ser. No. 14/509,334, filed on Oct. 8, 2014, which claims priority to Chinese Patent Application No. CN201310745701.3, filed on Dec. 30, 2013, the entire content of all of which is incorporated herein by reference.

FIELD OF THE DISCLOSURE

The present disclosure relates to the field of semiconductor fabrication technology and, more particularly, relates to memory devices.

BACKGROUND

In current semiconductor industry, integrated circuit (IC) products can be divided into three categories, i.e., analog circuits, digital circuits and digital/analog hybrid circuits. Memory device is an important type among digital circuits. In recent years, among memory devices, the development of flash memory is particularly rapid. A main feature of flash memory is the ability of long-term information storage without electric power. Therefore, flash memory have been widely applied to memory devices that need to retain stored data without losing the data due to a power outage and need to repeatedly read and write data. In addition, flash memory has a number of advantages such as high degree of integration, fast access speed, and ease of erasing and rewriting. Thus, flash memory devices are widely applied in many areas such as microcomputers, and automated control. Accordingly, how to improve performance of flash memory and reduce cost has become an important issue.

Furthermore, developing high-density flash memory technology can help to improve the performance of various types of portable electronic devices. For example, flash memory is used as a storage device in electronic devices such as digital camera, laptop, or tablet computer. Therefore, reducing the size of a flash memory cell and thus reducing the cost of the flash memory cell is one of the directions of technological development. For NOR gate electrically erasable programmable read-only memory with tunnel oxide layer (i.e., EPROM with Tunnel Oxide, ETOX, or Erase Through Oxide) flash memory, using a self-aligned electrical contact (i.e., Self-Align Contact) technology can reduce the size of the flash memory cell.

FIG. 1 depicts a cross-sectional view of a flash memory device formed using a self-aligned electrical contact process. The flash memory device includes a substrate 100 and one or more adjacent memory cells 101 on the surface of the substrate 100. One memory cell 101 includes a tunnel oxide layer 110 on the surface of the substrate 100, a floating gate layer 111 on the surface of the tunneling oxide layer 110, an insulating layer 112 on the surface of the floating gate layer 111, a control gate layer 113 on the surface of the insulating layer 112, and a silicon nitride layer 114 on the surface of the control gate layer 113.

In addition, the flash memory device includes a source region or a drain region 102 within the substrate 100 between adjacent memory cells 101. The flash memory device further includes sidewall spacers 103 on the surface of the substrate 100 on both sides of the memory cells 101. The flash memory device further includes an electrical interconnect structure 105 on the surface substrate of the sidewall spacers 103, on the surface of the silicon nitride layer 114, and on the surface of the substrate 100 between the adjacent memory cells 101.

In order to reduce the resistance of the control gate layer 113, and accordingly to improve performance and stability of the flash memory device and reduce energy consumption and heat loss, a metal silicide layer 115 is formed in the control gate layer 113 using a self-aligned silicide process. In addition, the metal silicide layer 115 is located on a portion of the sidewall surface of the gate control layer 113.

However, the flash memory device formed using existing technology still has relatively low stability and poor reliability. The disclosed methods and structures are directed to solve one or more problems set forth above and other problems.

BRIEF SUMMARY OF THE DISCLOSURE

One aspect of the present disclosure includes methods for forming a memory device. In an exemplary method, a substrate can be provided. One or more adjacent memory cells can be formed on the substrate. A memory cell of the one or more adjacent memory cells can include a first dielectric layer on the substrate, a floating gate layer on the first dielectric layer, a second dielectric layer on the floating gate layer, a control gate layer on the second dielectric layer, and a first mask layer on the control gate layer. The control gate layer can have a first portion and a second portion on the first portion. A silicide layer can be formed in the control gate layer and can cover at least a sidewall of the second portion of the control gate layer. A portion of the silicide layer can be removed using a pull-back process to reduce a size of the silicide layer in a direction parallel to a surface of the substrate. After the pull-back process, a fourth dielectric layer can be formed on the substrate and on the memory cell. The fourth dielectric layer can have a top surface higher than a top surface of the memory cell. An opening can be formed in the fourth dielectric layer. The opening can expose a portion of the substrate between adjacent memory cells of the one or more memory cells. A conductive structure can be formed in the opening.

Another aspect of the present disclosure includes memory devices. An exemplary device can include a substrate and one or more adjacent memory cells on the substrate. A memory cell of the one or more adjacent memory cells can include a first dielectric layer on the substrate, a floating gate layer on the first dielectric layer, a second dielectric layer on the floating gate layer, a control gate layer on the second dielectric layer, and a first mask layer on the control gate layer. The control gate layer can have a first portion and a second portion on the first portion. The device can further include a silicide layer in the control gate layer and covering at least a sidewall of the second portion of the control gate layer. In a direction parallel to a surface of the substrate, the silicide layer can have a size that is smaller than a size of the first portion of the control gate layer or a size of the floating gate layer. The device can further include a fourth dielectric layer on the substrate and on the memory cell. The fourth dielectric layer can have a top surface higher than a top surface of the memory cell. The device can further include an opening in the fourth dielectric layer. The opening can expose a portion of the substrate between adjacent memory cells of the one or more memory cells. The device can further include a conductive structure in the opening.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
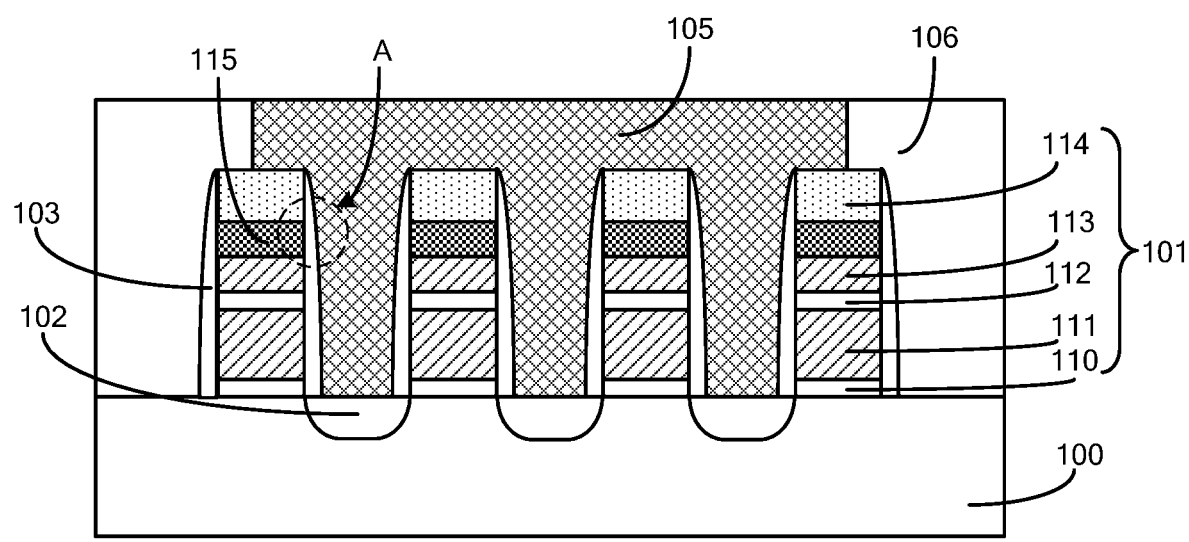
FIG. 1 depicts a cross-sectional view of a flash memory device formed using a self-aligned electrical contact process.

Flash memory devices formed using existing technology still have relatively low stability and poor reliability. It is found that, with the reducing of size and the increasing of density of semiconductor devices, the distance between adjacent memory cells 101 (as shown in FIG. 1) is reduced, such that the space between the adjacent memory cells 101 is not sufficient to form a conductive plug for connecting a source region or a drain region 102. In order to accomplish the electrical connection to the source region or the drain region 102, as shown in FIG. 1, an electrical interconnect structure 105 needs to be formed using a self-aligned electrical contact process.

Still referring to FIG. 1, the self-aligned electrical contact process can include the following steps. A dielectric layer 106 can be formed on the surface of a substrate 100, the surface of sidewall spacers 103, and the surface of the memory cells 101. A photoresist layer (not shown) can be formed on the surface of the dielectric layer 106. The photoresist layer can expose position(s) corresponding to the one or more memory cells 101. The dielectric layer 106 can be etched using the photoresist layer as an etching mask, until the surface of the silicon nitride layer 114 and the surface of the substrate 100 is exposed, to form an opening (not labeled) in the dielectric layer 106. The electrical interconnect structure 105 can be formed in the opening.

The formed electrical interconnect structure 105 can be in contact with the surface of the substrate 100, and thus can apply a voltage to the source region or the drain region 105. The electrical interconnect structure 105 can be electrically isolated from the floating gate layer 111 by the sidewall spacers 103. Moreover, the electrical interconnecting structure 105 can be electrically isolated from the control gate layer 113 and the metal silicide layer 115 by the silicon nitride layer 114 and the sidewall spacers 103. The silicon nitride layer 114 can protect the top surface of the control gate layer 113 during the etching of the dielectric layer 106 to form the opening. In addition, the silicon nitride layer 114 can achieve electrical isolation between the control gate layer 113 and the electrical interconnect structure 105 that is subsequent formed in the opening.

The electrical interconnect structure 105 formed using the self-aligned electrical contact process is located in the opening. The electrical interconnect structure 105 is only electrically isolated from the control gate layer 113 and the metal silicide layer 115 by the sidewall spacers 103. However, referring to a region A in FIG. 1, with the reducing of size and the increasing of density of semiconductor devices, the thickness of the sidewall spacers 103 is thinned accordingly. Thus, the distance between the electrical interconnect structure 105 and the metal silicide layer 115 is reduced. The breakdown voltage between the electrical interconnect structure 105 and the metal silicide layer 115 is reduced accordingly. However, the magnitude of the voltage that drives the operation of the memory cell 101 is not decreased. Therefore, when the voltage between the metal silicide layer 115 and the electrical interconnect structure 105 is sufficiently high, the sidewall spacer 103 can easily break down. Accordingly, a leakage current can be formed between the metal silicide layer 115 and the electrical interconnect structure 105. Thus, the formed flash memory device may have lower performance and lower reliability.

To solve the one or more problems set forth above and other problems, various embodiments provide a method for forming a memory device. In general, before a conductive structure is formed on the surface of a substrate between adjacent memory cells, a pull-back process can be used for removing a portion of a silicide layer, such that the size of the silicide layer parallel to the direction of the surface of the substrate can be reduced. That is, the sidewall surface of the silicide layer can have a certain distance from the sidewall surface of a control gate layer or a floating gate layer. After an opening is subsequently formed in a fourth dielectric layer, the distance between the sidewall of the opening and the sidewall of the silicide layer can be increased. After a conductive structure is formed within the opening, the distance between the conductive structure and the silicide layer can be increased. Thus, the breakdown voltage between the conductive structure and the silicide layer can be increased, such that a breakdown current can be difficult to produce between the conductive structure and the silicide layer, and the generating of a leakage current can be prevented. Therefore, the formed memory device can have stable performance and improve reliability.

Figure 8:
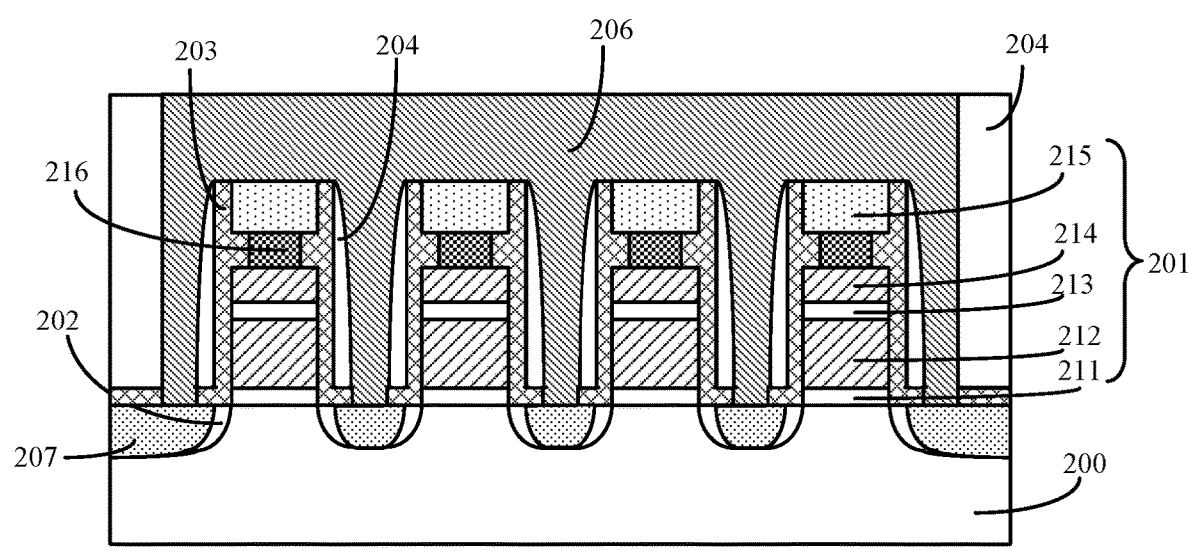
Figure 9:
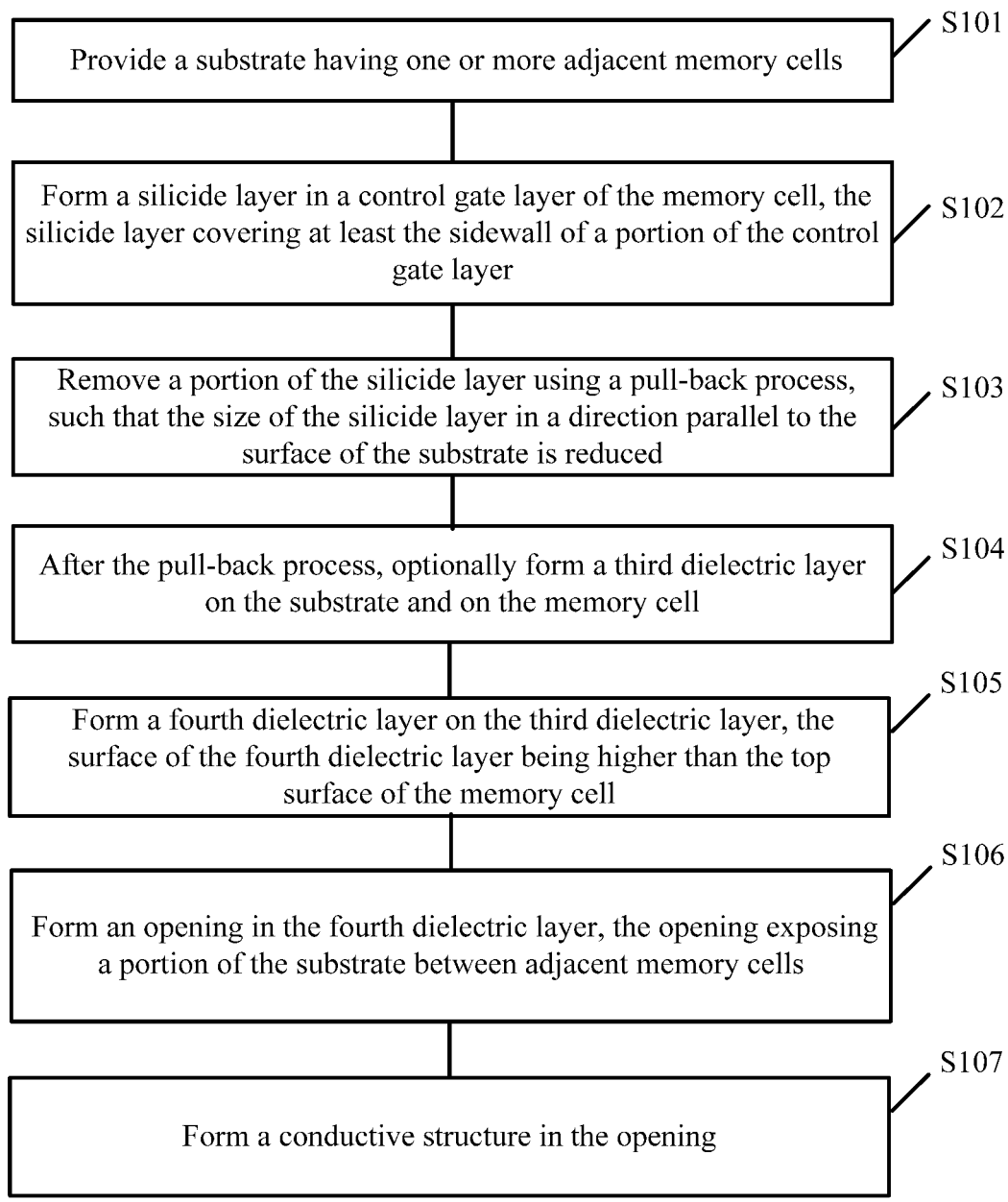
FIG. 9 depicts a flow diagram of an exemplary method for forming a memory device in accordance with various disclosed embodiments.

FIG. 9 depicts a flow diagram of an exemplary method for forming a memory device in accordance with various disclosed embodiments. FIGS. 2-8 depict cross-sectional views of the memory device at various stages during a fabrication process in accordance with various disclosed embodiments. Note that although FIGS. 2-8 depict semiconductor structures corresponding to the method depicted in FIG. 9, the semiconductor structures and the method are not limited to one another in any manner. As used herein, wherever applicable, con the sidewall of a certain structure can be used interchangeably with con the sidewall surface of the certain structure.

Figure 2:
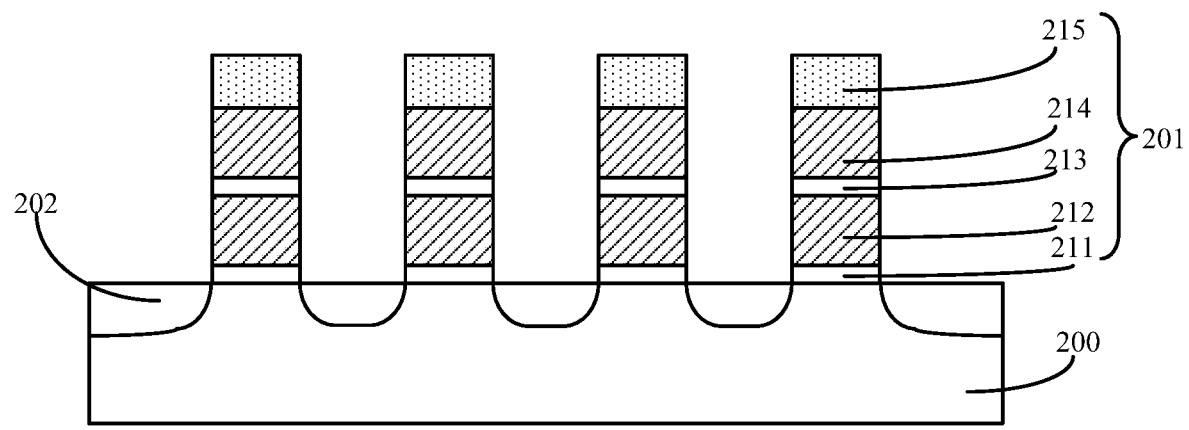
FIGS. 2-8 depict cross-sectional views of an exemplary memory device at various stages during a fabrication process in accordance with various disclosed embodiments.

In Step S101 of FIG. 9 and referring to FIG. 2, a substrate 200 is provided. The surface of the substrate 200 has one or more adjacent memory cells 201 thereon. A memory cell 201 can include a first dielectric layer 211 on the surface of the substrate 200, a floating gate layer 212 on the surface of the first dielectric layer 211, a second dielectric layer 213 on the surface of the floating gate layer 212, a control gate layer 214 on the surface of the second dielectric layer 213, and a first mask layer 215 on the surface of the control gate layer 214.

For example, the substrate 200 can be a silicon substrate, a silicon-germanium substrate, a silicon carbide substrate, a silicon-on-insulator (SOI) substrate, a germanium-on-insulator (GOI) substrate, a glass substrate, and/or a III-V group compound substrate, e.g., gallium nitride, or gallium arsenide.

A memory device formed by the one or more memory cells 201 can be a NOR gate electrically erasable programmable read-only memory with tunnel oxide layer (i.e., ETOX or Erase Through Oxide) flash memory device. The first dielectric layer 211 can be made of a material including silicon oxide. The first dielectric layer 211 can form a tunnel oxide layer. Via the first dielectric layer 211, electrons can migrate between the floating gate layer 212 and a channel region in the substrate 200, to implement operations including, e.g., writing, erasing, and/or programming.

The floating gate layer 212 can be made of a material including polysilicon. The floating gate layer 212 can store electrons, in order to achieve storage of data without electric power. The second dielectric layer 213 can be used for isolating the floating gate layer 212 and the control gate layer 214.

The second dielectric layer 213 can be made of a material including silicon oxide, silicon nitride, silicon oxynitride, or a combination thereof. In one embodiment, the second dielectric layer 213 can contain a silicon oxide layer, a silicon nitride layer on the surface of the silicon oxide layer, and a silicon oxide layer of the surface of the silicon nitride layer. That is, the second dielectric layer 213 can have a silicon oxide-silicon nitride-silicon oxide (ONO) structure. The ONO structure can have a strong isolation ability, and a desired ability of binding with polysilicon material. Thus, the ONO structure can effectively isolate the control gate layer 214 and the floating gate layer 212, and can control the binding between the control gate layer 214 and the floating gate layer 212 to be stable.

The control gate layer 214 can be made of a material including polysilicon. The control gate layer 214 can be used for applying a bias voltage to the floating gate layer 212 and, via various bias voltages, control the floating gate layer 212 at the bottom to implement actual operations including, e.g., writing, erasing, or programming.

For example, a process for forming the memory cell 201 can include the following steps. A first dielectric film can be formed on the surface of the substrate 200. A first polysilicon film can be formed on the surface of the first dielectric film. A second dielectric film can be formed on the surface of the first polysilicon film. A second polysilicon film can be formed on the surface of the second dielectric film. The first mask layer 215 can be formed on the surface of the second polysilicon film. The first mask layer 215 can cover a corresponding position where the memory cell 201 needs to be formed. Using the first mask layer 215 as an etching mask, the second polysilicon film, the second dielectric film, the first polysilicon film, and the first dielectric film can be etched using an anisotropic dry etching process until the surface of the substrate 200 is exposed, to form the first dielectric layer 211, the floating gate layer 212, the second dielectric layer 213, and the control gate layer 214. During the etching process, the first polysilicon film can be etched to form the floating gate layer 212, and the second polysilicon film can be etched to form the control gate layer 214.

For example, a process for forming the second polysilicon film, the second dielectric film, the first polysilicon film, and the first dielectric film can include a chemical vapor deposition process and/or a physical vapor deposition process. In addition, the first dielectric film can be formed by a thermal oxidation process or a wet oxidation process.

The first mask layer 215 can further protect the top surface of the control gate layer 214 during the subsequent forming of a conductive structure on the substrate 200 between adjacent memory cells 201. Thus, the control gate layer 214 can be electrically isolated from the conductive structure formed at the top of the memory cell 201.

In one embodiment, the first mask layer 215 can be made of a material including silicon nitride. For example, a process for forming the first mask layer 215 can include the following steps. A first mask film can be formed on the surface of the second polysilicon film. A photoresist layer can be formed on the surface of the first mask film. The photoresist layer can be exposed to be patterned. Using the patterned photoresist layer as an etching mask, the first mask film can be etched using an anisotropic dry etching process until the second polysilicon film is exposed, to form the first mask layer 215.

After the memory cell 201 is formed by etching using the first mask layer 215 as an etching mask, lightly-doped region(s) 202 can be formed in the substrate 200 on both sides of the memory cell 201 using, e.g., an ion implantation process. The ion implantation process for forming the lightly-doped region 202 can be referred to as the first ion implantation process.

Ions that are doped can include P-type ions or N-type ions. The ion implantation process can also use the first mask layer 215 as a mask. The lightly-doped regions 202 and subsequent-formed heavily-doped regions can form a source region and a drain region in the substrate 200 at both sides of each memory cell 201. The subsequently-formed conductive structure can be located on the surface of the source region and the drain region, and can be used for turning on a channel region at the bottom of a certain memory cell 201, in order to select the certain memory cell 201 for operation.

Figure 3A:
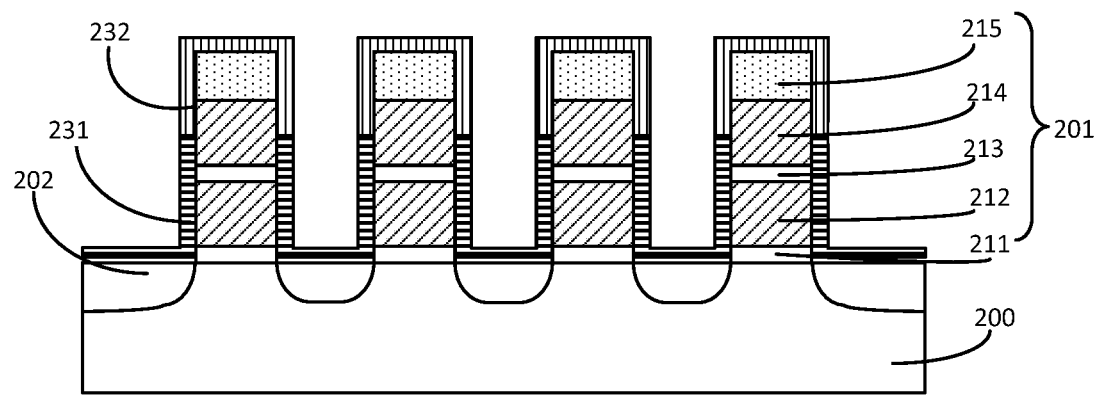
Figure 3B:
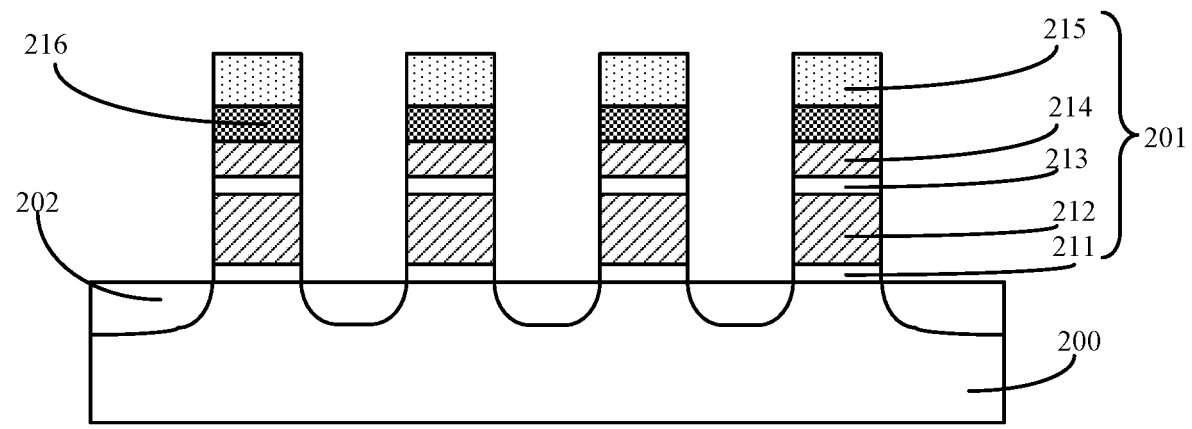

In Step S102 of FIG. 9 and referring to FIG. 3, a silicide layer 216 is formed in the control gate layer 214. The silicide layer 216 can cover at least the sidewall of a portion of the control gate layer 214.

In one embodiment, a process for forming the silicide layer 216 can include a self-aligned silicide (i.e., Self-Align Silicide) process. For example, the process of forming the silicide layer 216 can include the follow steps. A second mask layer (not shown) can be formed on the surface of the substrate 200 and on the sidewall of a portion of the memory cell 201. The second mask layer can cover the sidewall of both the first dielectric layer 211 and the floating gate layer 212, and expose at least the sidewall surface of a portion of the control gate layer 214. A metal layer (not shown) can be formed on the surface of the second mask layer and on the expose sidewall surface and top surface of the memory cell 201. An annealing process can be used to make metal atoms in the metal layer enter the control gate layer 214, to form the silicide layer 216 in the portion of the control gate layer 214. After the silicide layer 216 is formed, the metal layer that remains can be removed. After the remaining metal layer is removed, the second mask layer can be removed.

The second mask layer, as a mask for the self-aligned silicide process, can cover the surface of the substrate 200 and the portion of the memory cell 201 where the silicide layer 216 does not need to be formed. In one embodiment, the second mask layer can cover the surface of the substrate 200, the sidewall surface of the first dielectric layer 211, the sidewall surface of the floating gate layer 212, and the sidewall surface of a portion of the control gate layer 214. The silicide layer 216 can be formed at the exposed sidewall surface of the control gate layer 214.

For example, a process for forming the second mask layer can include the following steps. A second mask film can be deposited on the surface of the substrate 200 and the surface of the memory cell 201. A third mask film can be formed on the surface of the second mask film. The third mask film can be etched back, until the second mask film on the surface of the first mask layer 215 and on the sidewall surface of a portion of the control gate layer 214 is exposed. A third mask layer can thus be formed. Using the third mask film as an etching mask, the second mask film can be etched, until the surface of the first mask layer 215 and the sidewall surface of the portion of the control gate layer 214 is exposed. A second mask layer can thus be formed.

In one embodiment, after the second mask layer is formed, the third mask layer can be removed, the subsequently-formed metal layer can be located on the surface of the second mask layer. In another embodiment, after the second mask layer is formed, the third mask layer can be retained. In this case, the subsequently-formed metal layer can be formed on the surface of the third mask layer.

The second mask film and the third mask film can be made of different materials, i.e., the second mask film can be made of a material that is different from a material that the third mask film is made of. Thus, there can be an etching selectivity between the second mask film and the third mask film, such that, after the third mask film is etched back, the second mask film can be retained.

In addition, the first mask layer 215 and the second mask film can be made of different materials, i.e., the first mask layer 215 can be made of a material that is different from a material that the second mask film is made of. Thus, during the subsequent etching of the second mask film, the morphology of the first mask layer 215 is not damaged. Thus, during the subsequent process for forming the conductive structure, the first mask layer 215 can protect the top surface of the control gate layer 214. The first mask layer 215, the second mask film, and/or the third mask film can be made of a material including silicon oxide, silicon nitride, silicon oxynitride, amorphous carbon, and/or low-K dielectric material. Further, the third mask film can be made of a photoresist layer.

In one embodiment, the second mask film can be made of a material including silicon oxide. A process for forming the second mask film can include, e.g., a chemical vapor deposition process, an atomic layer deposition process, and/or a physical vapor deposition process. The third mask film can be made of a material including photoresist. A process for forming the third mask film can include, e.g., a spin-coating process, and/or a spray-coating process.

The metal layer can be made of a material including nickel, cobalt, titanium, tantalum, or a combination thereof. A process of forming the metal layer can include, e.g., a chemical liquid deposition process, a chemical vapor deposition process, and/or a physical vapor deposition process.

In one embodiment, the metal layer can be made of nickel. The metal layer can be formed using a chemical liquid deposition process. The chemical liquid deposition process can have a reaction solution including a $NiSO_4$ solution, and one or more of a $(NH_4)_2SO_4$ solution, a $NH_4F$ solution, and a $C_6H_5Na_3O_7$ solution. $NiSO_4$ can have a molar concentration in the reaction solution that ranges from about 0.01 mol/L to about 1 mol/L. The reaction solution can have a PH value ranging from about 8 to about 10. The chemical liquid deposition process can have a deposition time ranging from about 30 seconds to about 3000 seconds, and a deposition temperature ranging from about 0° C. to about 90° C.

The annealing process can include rapid thermal annealing, spike annealing (i.e., spike thermal annealing), and/or laser thermal annealing. For example, when rapid thermal annealing is being used, the rapid thermal annealing can have a temperature ranging from about 200° C. to about 500° C., a time (i.e., an annealing time) ranging from about 10 seconds to about 120 seconds, and a protective gas including nitrogen and/or inert gas. When spike annealing is used, the spike annealing can have a temperature ranging from about 300° C. to about 600° C., and a protective gas including nitrogen and/or an inert gas. When laser thermal annealing is being used, the laser thermal annealing can have a temperature ranging from about 500° C. to about 900° C., an annealing time ranging from about 0.1 ms to about 2 ms, and a protective gas including nitrogen and/or an inert gas. The thickness of the formed silicide layer 216 can be increased with the increasing of the annealing time.

Since the second mask layer can expose the sidewall surface of a portion of the control gate layer 214, the metal layer can be formed on the exposed sidewall surface of the control gate layer 214. During the annealing process, metal atoms in the metal layer can diffuse toward within the control gate layer 214 that is in contact with the metal layer. The metal atoms can react with the polysilicon of the control gate layer 214, to form a silicide material, i.e., to form the silicide layer 216 in the control gate layer 214, in order to reduce the resistance of the control gate layer 214. Accordingly, the drive voltage and power consumption of the memory cell 201 can be reduced. The performance and stability of the memory cell 201 can thus be improved.

In one embodiment, the control gate layer 214 can be made of a material including polysilicon. In this case, the silicide layer 216 can be made of a material including a silicide material, e.g., nickel silicide, cobalt silicide, titanium silicide, tantalum silicide, and/or cobalt-nickel silicide.

In one embodiment, the interior of the portion of the control gate layer 214 in contact with the metal layer can be substantially completely converted into the silicide material, i.e. the portion of the control gate layer 214 in contact with the metal layer can substantially entirely form the silicide layer 216. In another embodiment, the portion of the control gate layer 214 that is near the sidewall surface of the control gate layer 214 can form the silicide layer 216. In this case, the silicide layer 216 can surround the portion of the control gate layer 214 that is not converted into the silicide material.

In other words, the control gate layer 214 can have a first portion and a second portion on the first portion. In various embodiments, the second portion of the control gate layer 214 can have the silicide layer 216. The second portion of the control gate layer 214 can substantially entirely form the silicide layer 216. Alternatively, the outer part of the second portion of the control gate layer 214 can form the silicide layer 216. In this case, the silicide layer 216 can surround the inner part of the second portion of the control gate layer 214, and the inner part of the second portion of the control gate layer 214 is not converted into the silicide material.

Although the second portion, i.e., the upper portion of the control gate layer 214 has the silicide layer 216 according to various embodiments described above, the specific portion of the control gate layer 214 that can have the silicide layer 216 is not limited in the present disclosure. For example, alternatively, the first portion, i.e., the lower portion of the control gate layer 214 can have the silicide layer 216. In another example, alternatively, a middle portion of the control gate layer 214 can have the silicide layer 216. Any corresponding and appropriate methods can be used for forming the silicide layer 216 in the control gate layer 214.

A process for removing the remaining metal layer and the second mask layer can include a dry etching process, and/or a wet etching process. In one embodiment, the process for removing the remaining metal layer and the second mask layer can include a wet etching process. The wet etching process can have a desired selectivity, and thus does not damage the surface of the substrate 200 and the memory cell 201 during the removing of the remaining metal layer and the second mask layer.

After the silicide layer 216 is formed, the remaining control gate layer 214 and the silicide layer 216 can form a control gate of the memory cell 201. Thus, the resistance of the control gate can be reduced, such that the operating voltage of the memory cell 201 can be decreased. Accordingly, the energy consumption of the formed memory device can be reduced, the heat loss of the memory device can be reduced, and stability and reliability of the memory device can be improved. However, because the resistance of the silicide layer 216 is relatively low, electrons can thus accumulate more in the silicide layer 216 during the operation of memory cell 201. The subsequently-formed conductive structure can be located within the trench between adjacent memory cells 201. The conductive structure can be electrically isolated from the silicide layer by the subsequently-formed third dielectric layer. The distance from the sidewall of the silicide layer 216 to the conductive structure can be relatively small, which tends to cause the breakdown of the third dielectric layer between the sidewall of the silicide layer 216 and the conductive structure. In particular, the silicide layer 216 can contain a relatively great amount of electrons, which can cause leakage current to be generated between the silicide layer 216 and the conductive structure and cause the formed memory device to have unstable performance and of poor reliability.

Therefore, to reduce the leakage current, before the subsequent forming of the third dielectric layer, the silicide layer 216 can be thinned from the sidewall of the silicide layer 216. Thus, the distance between the sidewall of the silicide layer 216 and the subsequently-formed conductive structure can be increased, such that the breakdown voltage can be increased.

Figure 4:
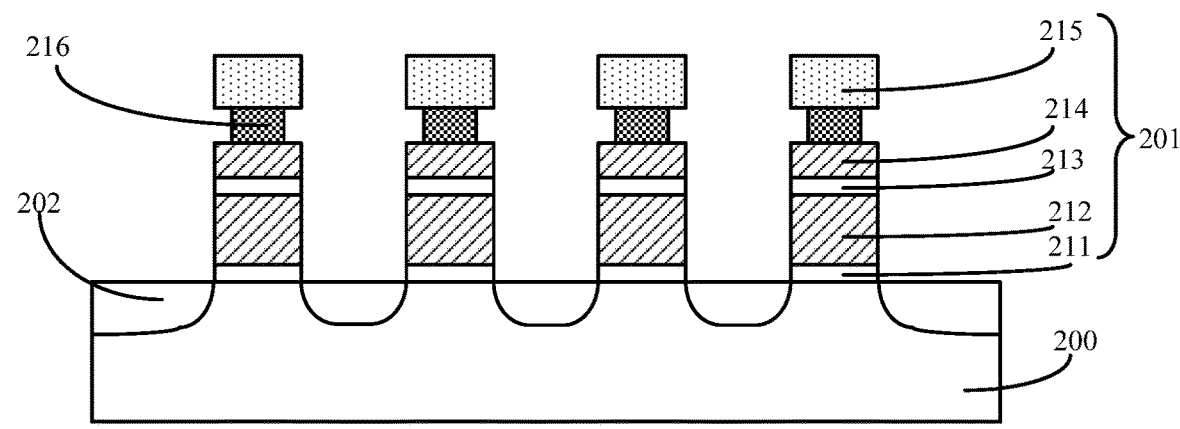

In Step S103 of FIG. 9 and referring to FIG. 4, a portion of the silicide layer 216 is removed using a pull-back process. Thus, the size of the silicide layer 216 in a direction parallel to the surface of the substrate 200 is reduced.

In one embodiment, the pull-back process can include an isotropic wet etching process. The isotropic wet etching process can have the same etch rate in each direction. In addition, the isotropic wet etching process can have a selectivity such that, during the etching of the silicide layer 216, the damage that the isotropic wet etching process causes to the floating gate layer 212 and the control gate layer 214 can be relatively small. Thus, the isotropic wet etching process can etch the silicide layer 216 from the sidewall of the silicide layer 216, such that the size of the silicide layer 216 in the direction parallel to the direction of the surface of the substrate 200 can be reduced. Therefore, the distance between the sidewall of the silicide layer 216 and the subsequent-formed conductive structure can be increased, which can make breakdown difficult to occur between the silicide layer 216 and the conductive structure. Thus, the generating of leakage current can be avoided.

In another embodiment, the pull-back process can include an isotropic dry etching process. The dry etching process can have a low power, e.g., of less than about 100 watts, such that the etching gas can have an etching rate in each direction, in order to achieve the etching of the sidewall of the silicide layer 216. In one embodiment, the etching gas can have substantially the same etching rate in each direction.

In one embodiment, in a preceding process, the interior of the portion of the control gate layer 214 in contact with the metal layer can be substantially completely converted into the silicide material. That is, the surface of the remaining control gate layer 214 can be covered by the silicide layer 216. For example, the surface of the portion of the control gate layer 214 in contact with the metal layer can be covered by the silicide layer 216. That is, the pull-back process can make the size of the silicide layer 216 in the direction parallel to the surface of the substrate 200 smaller than the size of the floating gate layer 212 and/or the control gate layer 214 in the direction parallel to the surface of the substrate 200, such that the sidewall of the silicide layer 216 can be recessed with respect to the sidewall of the floating gate layer 212 or the sidewall of the control gate layer 214. Thus, the distance between the sidewall surface of the silicide layer 216 and the subsequently-formed conductive structure can be increased.

In another embodiment, the silicide layer 216 can be formed on the sidewall of the inside of the control gate layer 214. That is, the silicide layer 216 can surround the portion of the control gate layer 214 that is not converted into the silicide material. In this case, the pull-back process can reduce the thickness of the silicide layer 216. Thus, the sidewall of the silicide layer 216 can be recessed with respect to the sidewall of the floating gate layer 212 or the sidewall of the control gate layer 214. Thus, the distance between the surface of the silicide layer 216 and the subsequently-formed conductive structure can be increased.

In one embodiment, the anisotropic wet etching process can have an etching solution including a Standard Clean (SC)-1 solution. The SC-1 solution can contain deionized water (DI water), hydrogen peroxide ($H_2O_2$), and aqueous ammonia ($NH_4OH$). The SC-1 solution can remove metal silicide and remove residual organic impurities that remain from the previous etching process. The SC-1 solution can have a relatively slow etching rate, and thus can precisely control the thickness of the thinned silicide layer 216.

For example, the SC-1 solution can have a volume ratio of DI water to aqueous ammonia ranging from about 5:1 to about 5:0.25, a volume ratio of hydrogen peroxide to aqueous ammonia ranging from about 1:1 to about 1:0.25, and a volume ratio of DI water to hydrogen peroxide of about 5:1. The anisotropic wet etching process can have a temperature ranging from about 10° C. to about 80° C. When the anisotropic wet etching process has a relatively high temperature, e.g., ranging from about 60° C. to about 80° C., the etching liquid can further remove a native oxide layer on the surface of the floating gate layer 212 and/or on the surface of the control gate layer 214.

Figure 5:
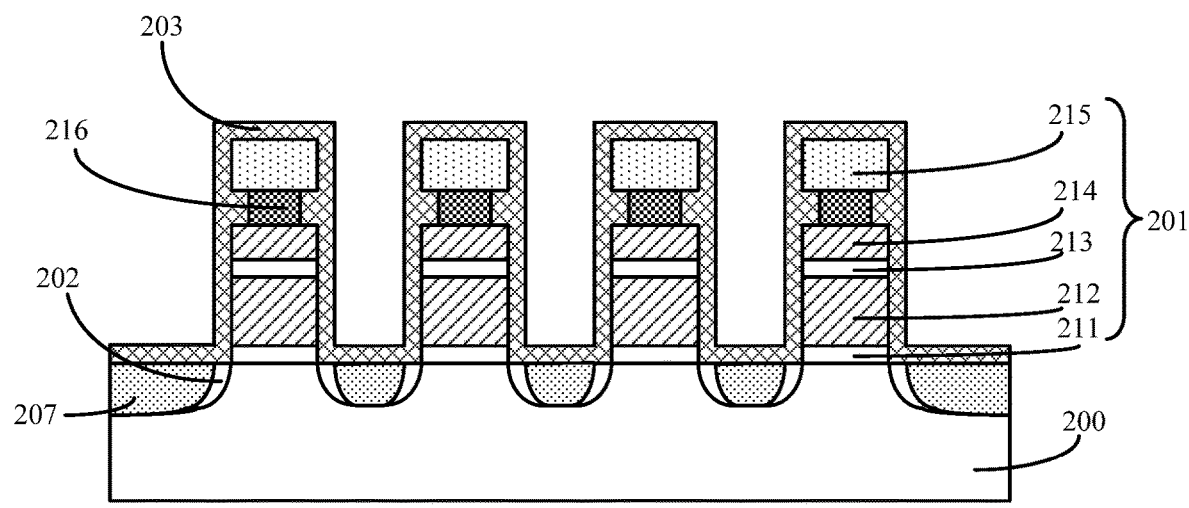

In Step S104 of FIG. 9 and referring to FIG. 5, after the pull-back process, optionally, a third dielectric layer 203 is formed on the surface of the substrate 200 and on the surface of the memory cell 201. The third dielectric layer 203 can be used as an etch stop layer during subsequent etching to form an opening. In addition, the third dielectric layer 203 can be used for electrically isolating a subsequently-formed conductive structure and the sidewall of the memory cell 201.

The third dielectric layer 203 can be made of a material including silicon oxide, silicon nitride, silicon oxynitride, or a combination thereof. For example, a process for forming the third dielectric layer 203 can include a chemical vapor deposition process, a physical vapor deposition process, and/or an atomic layer deposition process. In one embodiment, the process for forming the third dielectric layer 203 can be a plasma-enhanced chemical vapor deposition (PECVD) process.

In one embodiment, the third dielectric layer 203 can be formed by a silicon oxide layer and a silicon nitride layer on the surface of the silicon oxide layer. The silicon oxide layer can enhance the binding ability between the silicon nitride layer and the sidewall of the of the memory cell 201, e.g., the binding ability between the silicon nitride layer and the control gate layer 214, the silicide layer 216, and the floating gate layer 212. Thus, the electrical isolation performance of the third dielectric layer can be ensured, in order to prevent the generating of leakage current at the interface where the sidewall of the memory cell 201 is in contact with the third dielectric layer 203. Further, the silicon nitride layer can have strong electrical isolation ability, and thus can improve the breakdown voltage of the third dielectric layer 203. Thus, between the subsequently-formed conductive structure and the silicide layer 216, breakdown can be difficult to occur and leakage current can be difficult to generate.

In one embodiment, after the third dielectric layer 203 is formed, heavily-doped region(s) 207 can be formed in the substrate 200 at both sides of the memory cell 201 using an ion implantation process, using the memory cell 201 and the third dielectric layer 203 on the sidewall surface of the memory cell 201 as a mask. The ion implantation process for forming the heavily-doped region 207 can be referred to as the second ion implantation process.

The heavily-doped region 207 and the lightly-doped region 202 can form the source region or the drain region in the substrate 200 at both sides of the memory cell 201. The subsequently-formed conductive structure can be located on the surface of the heavily-doped region 207 and the lightly-doped region 202, in order to electrically connecting the source region and the drain region to an external circuit. During the ion implantation process, the third dielectric layer 203 can protect the surface of the substrate 200 from ion implantation damage, in order to improve quality of the contact interface between the subsequently-formed conductive structure and the surface of the substrate 200.

In another embodiment, before the subsequent forming of a fourth dielectric layer, the third dielectric layer 203 on the surface of the substrate 200 and on the top surface of the first mask layer 215 can be removed by an anisotropic dry etching process. Thus, sidewall spacers can be formed on the sidewall surface of the memory cell 201. The sidewall spacers can be used for electrically isolating the sidewall of the memory cell 201 from the subsequently-formed conductive structure. Moreover, the sidewall spacers can be used as, i.e., can form, a mask for forming the heavily-doped regions 207.

Figure 6:
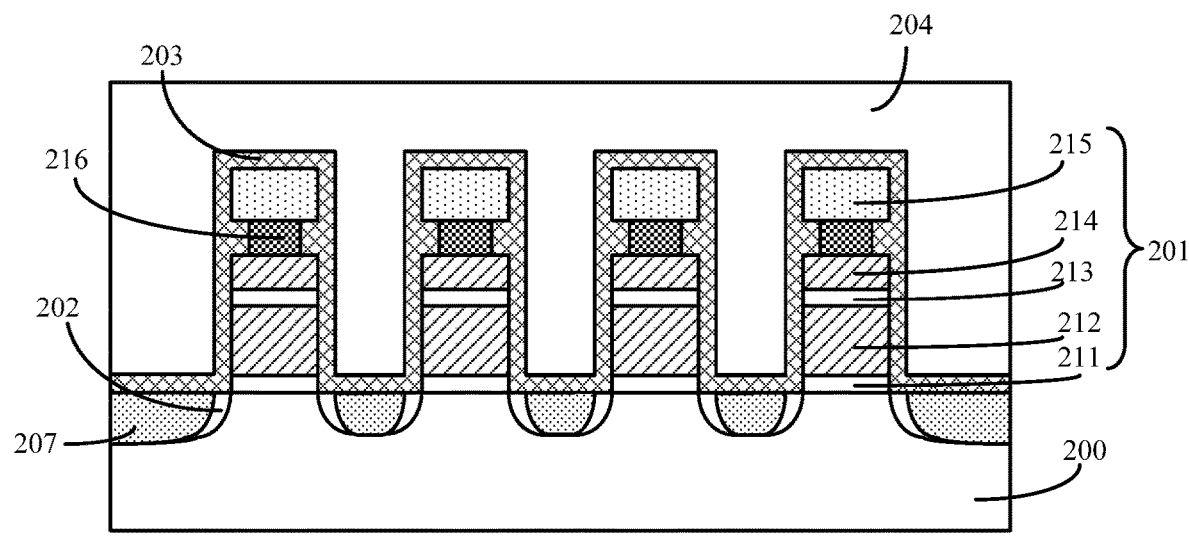

In Step S105 of FIG. 9 and referring to FIG. 6, a fourth dielectric layer 204 is formed on the surface of the third dielectric layer 203. The surface of the fourth dielectric layer 204 can be higher than, i.e., above, the top surface of the memory cell 201.

A conductive structure can be subsequently formed in the fourth dielectric layer 204. The fourth dielectric layer 204 can be used for electrically isolating the conductive structure and the memory cell 201.

The fourth dielectric layer 204 can be made of a material including silicon oxide, silicon nitride, silicon oxynitride, low-K dielectric material(s), or a combination thereof. Subsequently, in order to form a conductive structure using a self-aligned contact process, an opening needs to be formed in the fourth dielectric layer 204. The third dielectric layer 203 can be used as, i.e., can form, an etch stop layer for etching the opening. Thus, the fourth dielectric layer 204 and the third dielectric layer 203 can be made of different materials, such that the etching of the opening can have an etching selectivity between the fourth dielectric layer 204 and the third dielectric layer 203. In one embodiment, the surface of the third dielectric layer 203, i.e., the third dielectric layer 203, can be made of silicon nitride. The fourth dielectric layer 204 can be made of a material that is not silicon nitride.

For example, a process for forming the fourth dielectric layer 204 can include the following steps. A fourth dielectric film that fills the trench between adjacent memory cells 201 can be formed on the surface of the third dielectric layer 203, using a deposition process. The fourth dielectric film can be planarized using a chemical mechanical polishing (CMP) process, to form the fourth dielectric layer 204. For example, the process for depositing the fourth dielectric film can include a chemical vapor deposition process, and/or a physical vapor deposition process.

Figure 7:
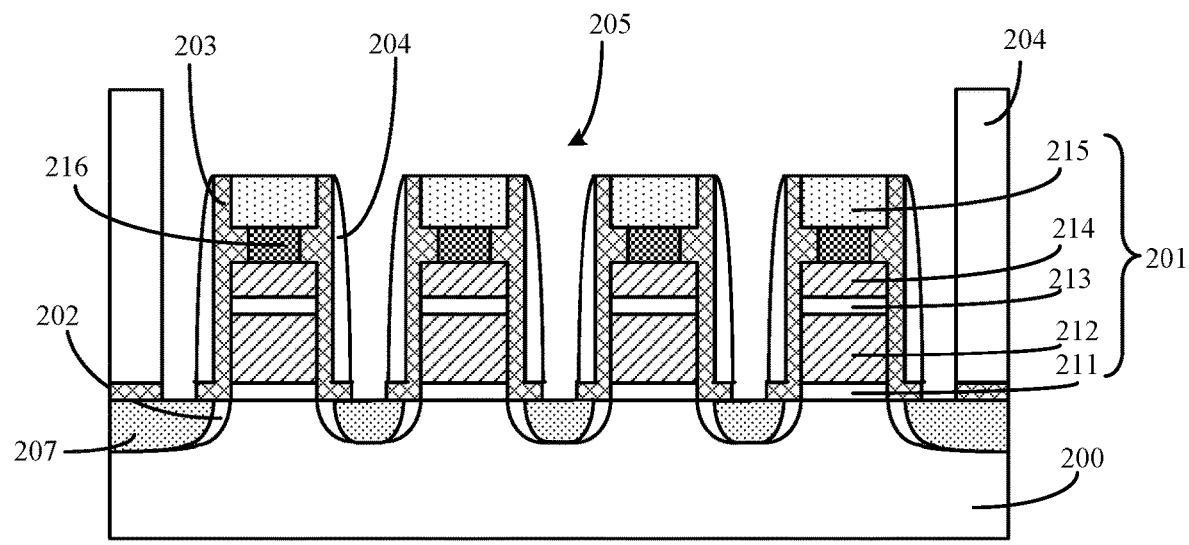

In Step S106 of FIG. 9 and referring to FIG. 7, opening(s) 205 are formed in the fourth dielectric layer 204. The openings 205 can expose the top surface of the first mask layer 215, a portion of the third dielectric layer 203 on the sidewall surface of the memory cells 201, and a portion of the surface of the substrate 200 between adjacent memory cells 201, i.e., on both sides of adjacent memory cells 201. In one embodiment, the openings 205 can expose a portion of the third dielectric layer 203 on the sidewall surface of the memory cells 201 that is at the top of the memory cells 201.

For example, a process for forming the opening 205 can include the following steps. A patterned mask can be formed on the surface of the fourth dielectric layer 204. The patterned mask can expose regions including the one or more memory cells 201, and a portion of the region surrounding the one or more memory cells 201. The fourth dielectric layer 204 and the third dielectric layer 203 can be etched using the patterned mask as an etching mask, until the top surface of the first mask layer 215 and a portion of the substrate 200 between adjacent memory cells 201 are exposed. A portion of the first dielectric layer 203 on the sidewall surface of the memory cell 201 and the first mask layer 215 can be used for electrically isolating the subsequently-formed conductive structure from the control gate layer 214 and from the floating gate layer 212.

A process for etching the fourth dielectric layer 204 can include an anisotropic dry etching process. The anisotropic dry etching process can be stopped at the surface of the third dielectric layer 203. The anisotropic dry etching process can have a direction perpendicular to the surface of the substrate 200. An etching gas can bombard in the direction perpendicular to the surface of the substrate 200. Therefore, in one embodiment, a portion of the fourth dielectric layer 204 located on the sidewall surface of the memory cell 201 can be retained. The subsequently-formed conductive structure can be electrically isolated from the sidewall of the memory cell 201 by the third dielectric layer 203 and the fourth dielectric layer 204.

After the third dielectric layer 203 on the top surface of the first mask layer 215 and on the surface of the substrate 200 is exposed, the third dielectric layer 203 can be etched. For example, a process for etching the third dielectric layer 203 can include a dry etching process and/or a wet etching process, to expose the surface of the substrate 200. In one embodiment, the third dielectric layer 203 at the bottom of the opening 205 can be etched by a wet etching process. Thus, the damage to the surface of the substrate 200 by the etching process can be relatively small.

In Step S107 of FIG. 9 and referring to FIG. 8, a conductive structure 206 is formed within the opening 205 (as shown in FIG. 7). For example, a process for forming the conductive structure 206 can include the following steps. A conductive layer can be formed on the surface of the fourth dielectric layer 204 and within the opening 205. The conductive layer can substantially fill the opening 205. The conductive layer can be planarized using a chemical mechanical polishing process, until the surface, i.e., the top surface, of the fourth dielectric layer 204 is exposed.

The conductive structure 206 can be formed on the surface of the heavily-doped region 207 and the lightly-doped region 202, in order to control the turning on or turning off of the channel region at the bottom of the memory cell 201, such that the conductive structure 206 can select a certain memory cell 201 for operations such as writing, erasing, or programming. That is the conductive structure 206 can form a select gate or a bit line of the formed memory device.

The conductive structure 206 can be made of a metal material including, e.g., copper, tungsten, and/or aluminum. The conductive structure 206 can be formed on the third dielectric layer 203, the fourth dielectric layer 204, the surface of the first mask layer 215, and the surface of the substrate 200 between adjacent memory cells 201.

In one embodiment, a barrier layer can be further formed between the conductive structure 206 and the sidewall and bottom surface of the opening 205. The barrier layer can be made of a material including titanium nitride, tantalum nitride, or a combination thereof. The barrier layer can be used as a stop position, i.e., a stop layer, of the chemical mechanical polishing process.

Because the size of the silicide layer 216 in a direction parallel to the surface of the substrate 200 is reduced via the pull-back process, the sidewall surface of the silicide layer 216 can be recessed with respect to or relative to the sidewall surface of the control gate layer 214 and the sidewall surface of floating gate layer 212. The distance from the sidewall of the silicide layer 216 to the conductive structure 206 can be relatively large.

Moreover, the sidewall of the silicide layer 216 can be electrically isolated from the conductive structure 206 by the third dielectric layer 203 and the fourth dielectric layer 204. Therefore, the thickness, i.e., the total thickness, of the third dielectric layer 203 and the fourth dielectric layer 204 for electrical isolation can be increased. Thus, the breakdown voltage between the sidewall of the silicide layer 216 and the conductive structure 206 can be increased, to prevent the generating of leakage due to the breakdown occurring between the sidewall of the silicide layer 216 and the conductive structure 206. Thus, the formed device structure can have stable performance and improved reliability.

In the methods according to various embodiments, before a conductive structure is formed on the surface of a substrate between adjacent memory cells, a portion of a silicide layer can be removed using a pull-back process, such that the size of the silicide layer in a direction parallel to the surface of the substrate can be reduced. That is, the sidewall surface of the silicide layer can have a certain distance from the sidewall surface of a control gate layer or a floating gate layer. After an opening is subsequently formed in a fourth dielectric layer, the distance between the sidewall of the opening and the sidewall of the silicide layer can be increased. After the conductive structure is formed within the opening, the distance between the conductive structure and the silicide layer can be increased. Thus, the breakdown voltage between the conductive structure and the silicide layer can be increased, such that a breakdown current can be difficult to produce between the conductive structure and the silicide layer, and the generating of a leakage current can thus be prevented. Therefore, the formed memory device can have stable performance and improved reliability.

Accordingly, various embodiments also provide a memory device. Referring to FIG. 8, the memory device can include a substrate 200, and one or more adjacent memory cells 201 on the surface of the substrate 200. A memory cell can include a first dielectric layer 211 on the surface of the substrate 200, a floating gate layer 212 on the surface of the first dielectric layer 211, a second dielectric layer 213 on the surface of the floating gate layer 212, a control gate layer 214 on the surface of the second dielectric layer 213, and a first mask layer 215 on the surface of the control gate layer 214, and a silicide layer 216 located in the control gate layer 214. The silicide layer 216 can cover at least a portion of the sidewall of the control gate layer 214. The size of the silicide layer 216 in the direction parallel to the surface of the substrate 200 can be smaller than size of the floating gate layer 212 or the control gate layer 214 in the direction parallel to the surface of the substrate 200. The memory device can further include a third dielectric layer 203 on the substrate of the surface 200 and the memory cell 201. A fourth dielectric layer 204 can be formed on the third dielectric layer 203. The top surface of the fourth dielectric layer 204 can be above, i.e., higher than, the top surface of the memory cell 201. An opening 205 (referring to FIG. 7) can be formed in the fourth dielectric layer 204. The opening 205 can expose the top surface of the first mask layer 215, a portion of the third dielectric layer 203 at the sidewall surface of the memory cell 201, and a portion of the surface of the substrate 200 on both sides of adjacent memory cells 201. The memory device can further include a conductive structure 206 located within the opening 205.

In the structure according to various disclosed embodiments as disclosed above, the size of the silicide layer 216 in the direction parallel to the surface of the substrate 200 can be smaller than the size of the floating gate layer 212 or the control gate layer 214 in the direction parallel to the surface of the substrate 200. That is, in the direction parallel to the surface of the substrate 200, the sidewall surface of the silicide layer 216 can have a certain distance from the sidewall surface of the control gate layer 214 or the floating gate layer 212, such that the distance between the sidewall of the opening 205 and the sidewall of the silicide layer 216 can be increased. Thus, the breakdown voltage between the conductive structure 206 and the silicide layer 216 can be increased, to prevent the generating of breakdown current between the conductive structure 206 and the silicide layer 216. Thus, the memory device can have stable performance and improved reliability.

In certain embodiments, memory devices and methods for forming the same are provided. An exemplary memory device can be used for forming a NOR gate ETOX flash memory device for advanced 45 nm process node. An exemplary method is shown in FIGS. 2-8. In the exemplary method, the silicide layer 216 can be made of a material including nickel silicide, or cobalt silicide. Using a pull-back process, the silicide layer can be pulled back, such that the minimum thickness or minimum distance between the control gate layer 214 (i.e., the silicide layer 216 of the control gate layer 214) and the conductive structure 206 can be increased. Thus, device fabrication yield and the cycling performance of the device can be improved. Process window for preventing short circuit or leakage current between the control gate layer 214 and the conductive structure 206 can be increased. In addition, the silicide layer 216 of the control gate layer 214 can be used for reducing the resistance of the control gate layer 214.

Optionally, the pull-back process can use an SC-1 solution to pull back the silicide layer 216. Optionally, the third dielectric layer 203 can be formed by a silicon oxide layer and a silicon nitride layer on the surface of the silicon oxide layer. Optionally, the conductive structure 206 can be made of tungsten, and can be planarized using a chemical mechanical polishing process.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A memory device, comprising:
    a substrate;
    one or more adjacent memory cells on the substrate, a memory cell including a first dielectric layer on the substrate, a floating gate layer on the first dielectric layer, a second dielectric layer on the floating gate layer, a control gate layer on the second dielectric layer, and a first mask layer on the control gate layer, wherein the control gate layer has a first portion and a second portion on the first portion;
    a silicide layer in the control gate layer and covering at least a sidewall of the second portion of the control gate layer, wherein, in a direction parallel to a surface of the substrate, the silicide layer has a size that is smaller than a size of the first portion of the control gate layer or a size of the floating gate layer;
    a third dielectric layer on the substrate and covering sidewall surfaces of the memory cell, wherein the third dielectric layer is conformally formed on and completely covers the sidewall surfaces of the memory cell and sidewalls of the silicide layer and has an extrusion directly sandwiched between the control gate layer and the first mask layer on the sidewall surfaces of the memory cell and the extrusion is directly abutting a sidewall of the silicide layer, a bottom surface of the first mask layer, and a top surface of the first portion of the control gate;
    a fourth dielectric layer on the substrate, the third dielectric layer, and on the memory cell, the fourth dielectric layer having a top surface higher than a top surface of the memory cell, wherein the fourth dielectric layer contains an opening exposing a portion of the substrate between adjacent memory cells of the one or more memory cells, a top surface of the first mask layer, a portion of the third dielectric layer on a sidewall of the memory cell, and the third dielectric layer is used as an etching stop layer to form the opening in the fourth dielectric layer;
    a lightly-doped region in the substrate on both sides of the memory cell;
    a heavily-doped region in the substrate at the both sides of the memory cell, wherein:
        the lightly-doped region has two edges, each aligned with a corresponding sidewall surface of the memory cell,
        the heavily-doped region has two edges, each aligned with a corresponding sidewall surface of a portion of the third dielectric layer on the sidewall surface of the memory cell, and
        the lightly-doped region and the heavily-doped region have a same depth in the substrate; and
    a conductive structure in the opening, wherein the silicide layer is separated from the conductive structure by the third dielectric layer and the fourth dielectric layer.

2. The device according to claim 1, wherein:
    the first mask layer is made of a material including silicon nitride.

3. The device according to claim 1, wherein the floating gate layer and the control gate layer are made of a material including polysilicon.

4. The device according to claim 1, wherein:
    the fourth dielectric layer and the third dielectric layer are made of a different material, respectively; and
    the third dielectric layer is made of a material including silicon oxide, silicon nitride, silicon oxynitride, or a combination thereof.

5. The device according to claim 1, wherein:
    the fourth dielectric layer is made of a material including silicon oxide, silicon nitride, silicon oxynitride, a low-K dielectric material, or a combination thereof.

6. The device according to claim 1, wherein the silicide layer is made of a material including nickel silicide, cobalt silicide, titanium silicide, tantalum silicide, cobalt-nickel silicide, or a combination thereof.

7. The device according to claim 1, wherein:
    the first dielectric layer is made of a material including silicon oxide; and
    the second dielectric layer is made of a material including silicon oxide, silicon nitride, silicon oxynitride, or a combination thereof.

8. The device according to claim 1, wherein the third dielectric layer is formed by a silicon oxide layer, and a silicon nitride layer on the silicon oxide layer.

9. The device according to claim 1, wherein:
    the silicide layer under the first mask layer is formed by converting a portion of an initial control gate layer and a remaining portion of an initial control gate layer forms the control gate layer, wherein a thickness of the silicide layer equals a thickness of the second portion of the control gate layer.

* * * * *